(12) United States Patent
Check et al.

(10) Patent No.: US 12,557,443 B2
(45) Date of Patent: Feb. 17, 2026

(54) CONTACT STRUCTURES IN LIGHT-EMITTING DIODE CHIPS FOR REDUCED VOIDING OF BONDING METALS

(71) Applicant: CreeLED, Inc., Durham, NC (US)

(72) Inventors: Michael Check, Holly Springs, NC (US); Justin White, Morrisville, NC (US); Steven Wuester, Wake Forest, NC (US); Nikolas Hall, Durham, NC (US); Kevin Haberern, Cary, NC (US); Colin Blakely, Raleigh, NC (US); Jesse Reiherzer, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 379 days.

(21) Appl. No.: 18/302,168

(22) Filed: Apr. 18, 2023

(65) Prior Publication Data
US 2023/0395754 A1    Dec. 7, 2023

Related U.S. Application Data

(60) Provisional application No. 63/365,647, filed on Jun. 1, 2022.

(51) Int. Cl.
*H10H 20/831* (2025.01)
*H01L 25/075* (2006.01)
(Continued)

(52) U.S. Cl.
CPC ..... *H10H 20/8312* (2025.01); *H01L 25/0753* (2013.01); *H10H 20/841* (2025.01); *H10H 20/8506* (2025.01); *H10H 20/857* (2025.01)

(58) Field of Classification Search
None
See application file for complete search history.

(56) References Cited

U.S. PATENT DOCUMENTS

| | | |
|---|---|---|
| 10,879,441 B2 | 12/2020 | Check |
| 11,094,848 B2 | 8/2021 | Breva et al. |

(Continued)

FOREIGN PATENT DOCUMENTS

| | | |
|---|---|---|
| TW | 200625690 A | 7/2006 |
| TW | 200733432 A | 9/2007 |

OTHER PUBLICATIONS

International Search Report and Written Opinion for International Patent Application No. PCT/US2023/023946, mailed Sep. 27, 2023, 14 pages.

(Continued)

*Primary Examiner* — Anthony Ho
(74) *Attorney, Agent, or Firm* — Withrow & Terranova, P.L.L.C.

(57) ABSTRACT

Solid-state lighting devices including light-emitting diodes (LEDs) and more particularly contact structures in LED chips for reducing voiding of bonding metals are disclosed. LED chips include active LED structures on carrier submounts and contact structures arranged to receive external electrical connections adjacent the active LED structures. Exemplary contact structures include contacts electrically coupled to active LED structures and dielectric structures beneath the contacts. Dielectric structures are arranged beneath portions of the contacts while still allowing electrical connections therethrough. Such dielectric structures may be provided as regions of dielectric material with spacings that control topography of underlying bonding metals to reduce voiding.

20 Claims, 8 Drawing Sheets

(51) Int. Cl.
  *H10H 20/841*    (2025.01)
  *H10H 20/85*     (2025.01)
  *H10H 20/857*    (2025.01)

(56) References Cited

U.S. PATENT DOCUMENTS

2015/0249196 A1   9/2015   Williams et al.
2016/0211417 A1   7/2016   Katsuno et al.
2019/0181300 A1   6/2019   Park et al.
2020/0395524 A1  12/2020   Check

OTHER PUBLICATIONS

Office Action for Taiwanese Patent Application No. 112119478, mailed Nov. 29, 2024, 5 pages.
Preliminary Examination Report for Taiwanese Patent Application No. 112119478, mailed Jul. 31, 2024, 22 pages.
Examination Report for Taiwanese Patent Application No. 112119478, mailed Apr. 9, 2024, 21 pages.
Notice of Allowance for Taiwanese Patent Application No. 112119478, mailed Mar. 12, 2025, 3 pages.

CONTACT STRUCTURES IN LIGHT-EMITTING DIODE CHIPS FOR REDUCED VOIDING OF BONDING METALS

RELATED APPLICATIONS

This application claims the benefit of provisional patent application Ser. No. 63/365,647, filed Jun. 1, 2022, the disclosure of which is hereby incorporated herein by reference in its entirety.

FIELD OF THE DISCLOSURE

The present disclosure relates to solid-state lighting devices including light-emitting diodes (LEDs) and more particularly to contact structures in LED chips for reducing voiding of bonding metals.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An active region may be fabricated, for example, from silicon carbide, gallium nitride, gallium phosphide, aluminum nitride, and/or gallium arsenide-based materials and/or from organic semiconductor materials. Photons generated by the active region are initiated in all directions.

As advancements in modern LED technology progress, the art continues to seek improved LEDs and solid-state lighting devices having desirable illumination characteristics capable of overcoming challenges associated with conventional devices.

SUMMARY

The present disclosure relates to solid-state lighting devices including light-emitting diodes (LEDs) and more particularly to contact structures in LED chips for reducing voiding of bonding metals. LED chips include active LED structures on carrier submounts and contact structures arranged to receive external electrical connections adjacent the active LED structures. Exemplary contact structures include contacts electrically coupled to active LED structures and dielectric structures beneath the contacts. Dielectric structures are arranged beneath portions of the contacts while still allowing electrical connections therethrough. Such dielectric structures may be provided as regions of dielectric material with spacings that control topography of underlying bonding metals to reduce voiding.

In one aspect, an LED chip comprises: a carrier submount; an active LED structure bonded to the carrier submount, the active LED structure comprising an n-type layer, a p-type layer, and an active layer that is between the n-type layer and the p-type layer, the active LED structure forming a mesa with mesa sidewalls that define a perimeter of the active LED structure; a contact on the carrier submount in a position that is outside the mesa sidewalls; a barrier layer forming an electrically conductive path between the active LED structure and the contact; and a dielectric structure between the contact and the carrier submount, the barrier layer electrically connecting with the contact adjacent the dielectric structure. In certain embodiments, the dielectric structure forms one or more regions of dielectric material that are registered below the contact. In certain embodiments, the dielectric structure forms a plurality of regions of dielectric material that are registered below the contact. In certain embodiments, the plurality of regions of dielectric material are arranged with a pitch that is less than or equal to 11 microns ($\mu$m). In certain embodiments, the plurality of regions of dielectric material form a plurality of stripes below the contact. In certain embodiments, the plurality of regions of dielectric material form a plurality of islands below the contact. The LED chip may further comprise a dielectric reflective layer on the active LED structure; and a metal reflective layer on the dielectric reflective layer and electrically coupled to the active LED structure through the dielectric reflective layer, wherein the dielectric structure comprises a same material as the dielectric reflective layer. In another embodiment, the dielectric structure comprises a different material than the dielectric reflector layer. The LED chip may further comprise an n-contact metal electrically coupled with the n-type layer, wherein a portion of the n-contact metal extends to a position that is beneath the contact and between the barrier layer and the carrier submount. The LED chip may further comprise a passivation layer that is between the barrier layer and the n-contact metal. In certain embodiments, the n-contact metal forms a contour shape beneath the contact, and the contour shape is defined by a shape of the dielectric structure.

In another aspect, an LED chip comprises: a carrier submount; an active LED structure bonded to the carrier submount, the active LED structure comprising an n-type layer, a p-type layer, and an active layer that is between the n-type layer and the p-type layer, the active LED structure forming a mesa with mesa sidewalls that define a perimeter of the active LED structure; a p-contact on the carrier submount in a position that is outside the mesa sidewalls; a barrier layer forming an electrically conductive path between the p-type layer and the p-contact; and a dielectric structure beneath the p-contact in a position that is between the barrier layer and the p-contact. In certain embodiments, the dielectric structure forms a plurality of dielectric regions that are beneath the p-contact, and the barrier layer electrically connects with the p-contact between adjacent dielectric regions of the plurality of dielectric regions. In certain embodiments, the plurality of dielectric regions is arranged with a pitch in a range from 0.5 $\mu$m to less than or equal to 11 $\mu$m. In certain embodiments, the plurality of dielectric regions form a plurality of stripes beneath the p-contact. In certain embodiments, the plurality of dielectric regions form a plurality of islands beneath the p-contact. The LED chip may further comprise: a dielectric reflective layer on the active LED structure; and a metal reflective layer on the dielectric reflective layer and electrically coupled to the p-type layer through the dielectric reflective layer, wherein the dielectric structure comprises a same material as the dielectric reflective layer. In other embodiments, the dielectric structure comprises a different material than the dielectric reflective layer. The LED chip may further comprise an n-contact metal electrically coupled with the n-type layer, wherein a portion of the n-contact metal extends to a position that is beneath the p-contact and between the barrier layer and the carrier submount, and wherein the n-contact metal forms a contour shape beneath the p-contact and the contour shape is defined by a shape of the dielectric structure. The LED chip may further comprise a passivation layer that is between the barrier layer and the n-contact metal.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
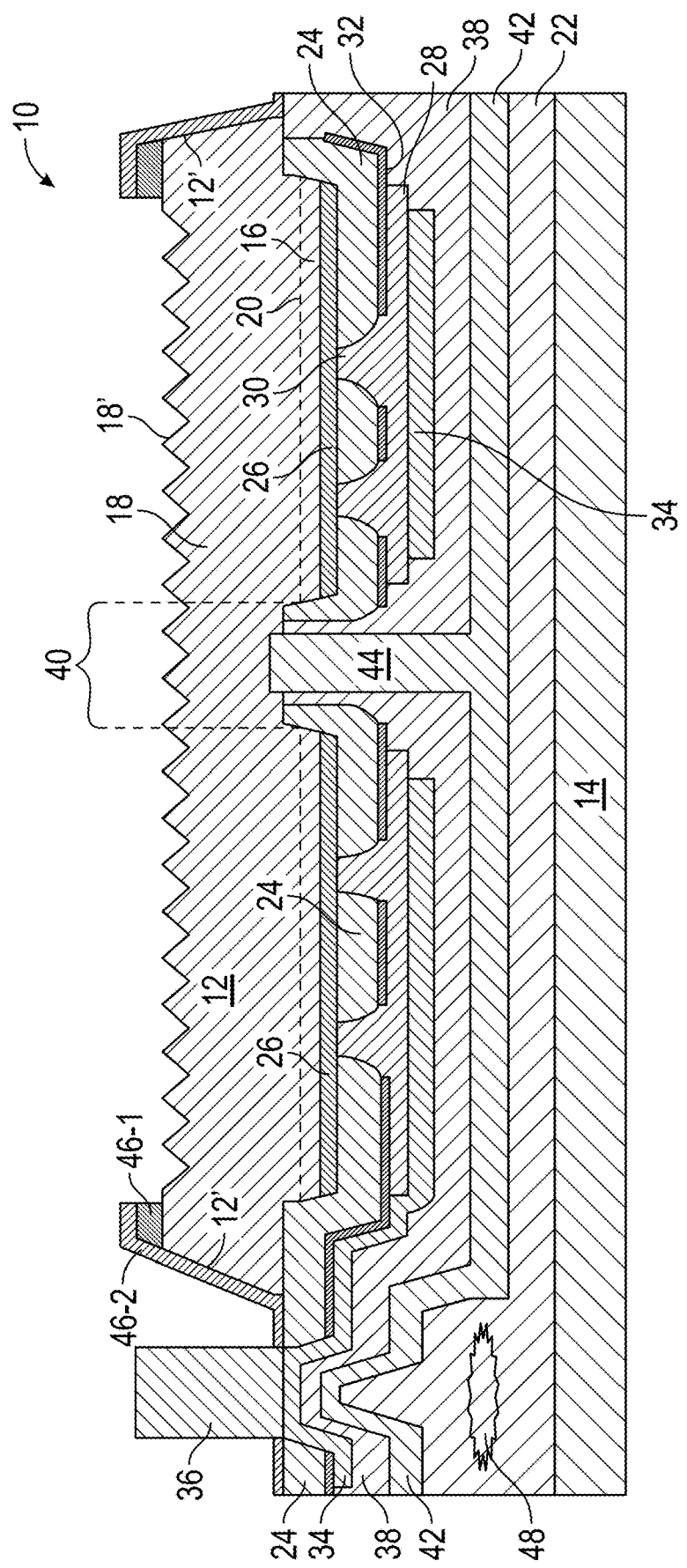
FIG. 1 is a generalized cross-section of a light-emitting diode (LED) chip that embodies a vertical chip structure according to principles of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to solid-state lighting devices including light-emitting diodes (LEDs) and more particularly to contact structures in LED chips for reducing voiding of bonding metals. LED chips include active LED structures on carrier submounts and contact structures arranged to receive external electrical connections adjacent the active LED structures. Exemplary contact structures include contacts electrically coupled to active LED structures and dielectric structures beneath the contacts. Dielectric structures are arranged beneath portions of the contacts while still allowing electrical connections therethrough. Such dielectric structures may be provided as regions of dielectric material with spacings that control topography of underlying bonding metals to reduce voiding.

An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, un-doped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light transmissive optical properties.

Different embodiments of the active LED structure can emit different wavelengths of light depending on the composition of the active layer and n-type and p-type layers. In certain embodiments, the active LED structure may emit blue light with a peak wavelength range of approximately 430 nanometers (nm) to 480 nm. In other embodiments, the active LED structure may emit green light with a peak wavelength range of 500 nm to 570 nm. In other embodiments, the active LED structure may emit red light with a peak wavelength range of 600 nm to 650 nm. In certain embodiments, the active LED structure may emit light with a peak wavelength in any area of the visible spectrum, for example peak wavelengths primarily in a range from 400 nm to 700 nm.

In certain embodiments, the active LED structure may be configured to emit light that is outside the visible spectrum, including one or more portions of the ultraviolet (UV) spectrum, the infrared (IR) or near-IR spectrum. The UV spectrum is typically divided into three wavelength range categories denoted with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others. In other applications, UV LEDs may also be provided with one or more lumiphoric materials to provide LED packages with aggregated emissions having a broad spectrum and improved color quality for visible light applications. Near-IR and/or IR wavelengths for LED structures of the present disclosure may have wavelengths above 700 nm, such as in a range from 750 nm to 1100 nm, or more.

The LED chip can also be covered with one or more lumiphoric or other conversion materials, such as phosphors, such that at least some of the light from the LED chip is absorbed by the one or more phosphors and is converted to one or more different wavelength spectra according to the characteristic emission from the one or more phosphors. In some embodiments, the combination of the LED chip and the one or more phosphors emits a generally white combination of light. The one or more phosphors may include yellow (e.g., YAG:Ce), green (e.g., LuAg:Ce), and red (e.g., $Ca_{1-x-y}Sr_xEu_yAlSiN_3$) emitting phosphors, and combinations thereof. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. In some embodiments, one or more phosphors may include yellow phosphor (e.g., YAG:Ce), green phosphor (e.g., LuAg:Ce), and red phosphor (e.g., $Ca_{1-x-y}Sr_xEu_y$-$AlSiN_3$) and combinations thereof. One or more lumiphoric materials may be provided on one or more portions of an LED chip and/or a submount in various configurations. In certain embodiments, one or more surfaces of LED chips may be conformally coated with one or more lumiphoric materials, while other surfaces of such LED chips and/or associated submounts may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) are coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

Light emitted by the active layer or region of an LED chip typically is initiated in multiple directions. For directional applications, internal mirrors or external reflective surfaces may be employed to redirect as much light as possible toward a desired emission direction. Internal mirrors may include single or multiple layers. Some multi-layer mirrors include a metal reflector layer and a dielectric reflector layer, wherein the dielectric reflector layer is arranged between the metal reflector layer and a plurality of semiconductor layers. A passivation layer is arranged between the metal reflector layer and first and second electrical contacts, wherein the first electrical contact is arranged in conductive electrical communication with a first semiconductor layer, and the second electrical contact is arranged in conductive electrical communication with a second semiconductor layer. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure may be useful for LED chips having a variety of geometries, such as vertical geometry. A vertical geometry LED chip typically includes anode and cathode connections on opposing sides or faces of the LED chip. In certain embodiments, a vertical geometry LED chip may also include a growth substrate that is arranged between the anode and cathode connections. In certain embodiments, LED chip structures may include a carrier submount and where the growth substrate is removed. In still further embodiments, any of the principles described may also be applicable to flip-chip structures where anode and cathode connections are made from a same side of the LED chip for flip-chip mounting to another surface.

FIG. 1 is a generalized cross-section of an LED chip 10 that embodies a vertical chip structure according to principles of the present disclosure. The LED chip 10 includes an active LED structure 12 formed on a carrier submount 14. The active LED structure 12 generally refers to portions of the LED chip 10 that include semiconductor layers, such as epitaxial semiconductor layers, that form a structure that generates light when electrically activated. The active LED structure 12 is formed on and supported by the carrier submount 14 that can be made of many different materials, with a suitable material being silicon, or doped silicon. In certain embodiments, the carrier submount 14 comprises an electrically conductive material such that the carrier submount 14 is part of electrically conductive connections to the active LED structure 12. The active LED structure 12 may generally comprise a p-type layer 16, an n-type layer 18, and an active layer 20 arranged between the p-type layer 16 and the n-type layer 18. The active LED structure 12 may include many additional layers such as, but not limited to, buffer layers, nucleation layers, super lattice structures, un-doped layers, cladding layers, contact layers, current-spreading layers, and light extraction layers and elements. Additionally, the active layer 20 may comprise a single quantum well, a multiple quantum well, a double heterostructure, or super lattice structures. In FIG. 1, the p-type layer 16 is arranged between the active layer 20 and the carrier submount 14 such that the p-type layer 16 is closer to the carrier submount 14 than the n-type layer 18. The active LED structure 12 may initially be formed by epitaxially growing or depositing the n-type layer 18, the active layer 20, and the p-type layer 16 sequentially on a growth substrate. The active LED structure 12 may then be flipped and bonded to the carrier submount 14 by way of one or more bond metal layers 22 and the growth substrate is removed. In this manner, a top surface 18' of the n-type layer 18 forms a primary light extracting face of the LED chip 10. In certain embodiments, the top surface 18' may comprise a textured or patterned surface for improving light extraction. In other embodiments, the doping order may be reversed such that the n-type layer 18 is arranged between the active layer 20 and the carrier submount 14.

The LED chip 10 may include a first reflective layer 24 provided on the p-type layer 16. In certain embodiments, a current spreading layer 26 may be provided between the p-type layer 16 and the first reflective layer 24. The current spreading layer 26 may include a thin layer of a transparent conductive oxide such as indium tin oxide (ITO) or a thin metal layer such as Pt, although other materials may be used. The first reflective layer 24 may comprise many different materials and preferably comprises a material that presents an index of refraction step with the material of the active LED structure 12 to promote total internal reflection (TIR) of light generated from the active LED structure 12. Light that experiences TIR is redirected without experiencing absorption or loss and can thereby contribute to useful or desired LED chip emission. In certain embodiments, the first reflective layer 24 comprises a material with an index of refraction lower than the index of refraction of the active LED structure 12 material. The first reflective layer 24 may comprise many different materials, with some having an index of refraction less than 2.3, while others can have an index of refraction less than 2.15, less than 2.0, and less than 1.5. In certain embodiments, the first reflective layer 24 comprises a dielectric material, such as silicon dioxide ($SiO_2$) and/or silicon nitride (SiN). It is understood that many dielectric materials can be used such as SiN, $SiN_x$, $Si_3N_4$, Si, germanium (Ge), $SiO_2$, SiOx, titanium dioxide ($TiO_2$), tantalum pentoxide ($Ta_2O_5$), ITO, magnesium oxide (MgOx), zinc oxide (ZnO), and combinations thereof. In certain embodiments, the first reflective layer 24 may include multiple alternating layers of different dielectric materials, e.g., alternating layers of $SiO_2$ and SiN that symmetrically repeat or are asymmetrically arranged. Some Group III nitride materials such as GaN can have an index of refraction of approximately 2.4, $SiO_2$ can have an index of refraction of approximately 1.48, and SiN can have an index of refraction of approximately 1.9. Embodiments with the active LED structure 12 comprising GaN and the first reflective layer 24 comprising $SiO_2$ may form a sufficient index of refraction step between the two to allow for efficient TIR of light. The first reflective layer 24 may have different thicknesses depending on the type of materials used, with some embodiments having a thickness of at least 0.2 microns (µm). In some embodiments, the first reflective layer 24 can have a thickness in the range of 0.2 µm to 0.7 µm, while in some embodiments the thickness can be approximately 0.5 µm.

The LED chip 10 may further include a second reflective layer 28 that is on the first reflective layer 24 such that the first reflective layer 24 is arranged between the active LED structure 12 and the second reflective layer 28. The second reflective layer 28 may include a metal layer that is configured to reflect light from the active LED structure 12 that may pass through the first reflective layer 24. The second reflective layer 28 may comprise many different materials such as Ag, gold (Au), Al, nickel (Ni), titanium (Ti), or combinations thereof. The second reflective layer 28 may have different thicknesses depending on the type of materials used, with some embodiments having a thickness of at least 0.1 µm, or in a range including 0.1 µm to 0.7 µm, or in a range including 0.1 µm to 0.5 µm, or in a range including 0.1 µm to 0.3 µm. As illustrated, the second reflective layer 28 may include or form one or more reflective layer interconnects 30 that provide an electrically conductive path through the first reflective layer 24. In this manner, the one or more reflective layer interconnects 30 may extend through an entire thickness of the first reflective layer 24. In certain embodiments, the second reflective layer 28 is a metal reflective layer and the reflective layer interconnects 30 comprise reflective layer metal vias. Accordingly, the first reflective layer 24, the second reflective layer 28, and the reflective layer interconnects 30 form a reflective structure of the LED chip 10 that is on the p-type layer 16. As such, the reflective structure may comprise a dielectric reflective layer and a metal reflective layer as disclosed herein. In certain embodiments, the reflective layer interconnects 30 comprise the same material as the second reflective layer 28 and are formed at the same time as the second reflective layer 28. In other embodiments, the reflective layer interconnects 30 may comprise a different material than the second reflective layer 28. Certain embodiments may also comprise an adhesion layer 32 that is positioned at one or more interfaces between the first reflective layer 24 and the second reflective layer 28 to promote improved adhesion therebetween. Many different materials can be used for the adhesion layer 32, such as titanium oxide (TiO, $TiO_2$), titanium oxynitride (TiON, $Ti_xO_yN$), tantalum oxide (TaO, $Ta_2O_5$), tantalum oxynitride (TaON), aluminum oxide (AlO, $Al_xO_y$) or combinations thereof, with a preferred material being TiON, AlO, or AlxOy. In certain embodiments, the adhesion layer comprises $Al_xO_y$, where $1 \leq x \leq 4$ and $1 \leq y \leq 6$. In certain embodiments, the adhesion layer comprises $Al_xO_y$, where x=2 and y=3, or $Al_2O_3$. The adhesion layer 32 may be deposited by electron beam deposition that may provide a smooth, dense, and continuous layer without notable variations in surface morphology. The adhesion layer 32 may also be deposited by sputtering, chemical vapor deposition, plasma enhanced chemical vapor deposition, or atomic layer deposition (ALD).

The LED chip 10 may also comprise a barrier layer 34 on the second reflective layer 28 to prevent migration of material of the second reflective layer 28, such as Ag, to other layers. Preventing this migration helps the LED chip 10 maintain efficient operation throughout its lifetime. The barrier layer 34 may comprise an electrically conductive material, with suitable materials including but not limited Ti, Pt, Ni, Au, tungsten (W), and combinations or alloys thereof. In certain embodiments, the barrier layer 34 is arranged to laterally extend beyond portions of the active LED structure 12, or a peripheral border of the active LED structure 12 in order to provide an electrical connection with a p-contact 36. In this regard, an electrical path between the p-contact 36 and the p-type layer 16 may include the barrier layer 34, the second reflective layer 28, and the reflective layer interconnects 30. The p-contact 36, which may also be referred to as a bond pad, may provide a surface to receive an external electrical connection, for example by way of a wire bond. In other embodiments, the polarity may be reversed such that the p-contact 36 is replaced with an n-contact that is electrically coupled to the n-type layer 18, and electrical connections to the p-type layer 16 are made through the carrier submount 14. A passivation layer 38 is included on the barrier layer 34 as well as any portions of the second reflective layer 28 that may be uncovered by the barrier layer 34. The passivation layer 38 protects and provides electrical insulation for the LED chip 10 and can comprise many different materials, such as a dielectric material including but not limited to silicon nitride. In certain embodiments, the passivation layer 38 is a single layer, and in other embodiments, the passivation layer 38 comprises a plurality of layers. In certain embodiments, the passivation layer 38 may include one or more metal-containing interlayers arranged or embedded therein that may function as a crack stop layer for any cracks that may propagate through the passivation layer 38 as well as an additional light reflective layer.

In FIG. 1, the active LED structure 12 forms a first opening 40 or recess that extends through the p-type layer 16, the active layer 20, and a portion of the n-type layer 18. The first opening 40 may be formed by a subtractive material process, such as etching, that is applied to the active LED structure 12 before bonding with the carrier submount 14. As used herein, the first opening may also be referred to as an active LED structure opening. As illustrated, a portion of the first reflective layer 24, and adhesion layer 32, is arranged to cover sidewall surfaces of the p-type layer 16, the active layer 20, and the n-type layer 18 within the first opening 40. The passivation layer 38 extends along the first reflective layer 24 in the first opening 40 and is arranged on a surface of the n-type layer 18. The LED chip 10 further includes an n-contact metal layer 42 that is arranged on the passivation layer 38 and across the LED chip 10. At the first opening 40, the n-contact metal layer 42 extends into the first opening 40 to form an n-contact interconnect 44, which may be referred to as an n-contact via. In this manner, the first opening 40 may be defined where portions of the n-contact metal layer 42, the n-contact interconnect 44, the passivation layer 38, and the first reflective layer 24 extend into the active LED structure 12. As such, the n-contact metal layer 42 and the n-contact interconnect 44 may be integrally formed to provide an electrical connection to the n-type layer 18 through the first opening 40. In other embodiments, the n-contact metal layer 42 and the n-contact interconnect 44 may be separately formed and may comprise the same or different materials. In certain embodiments, the n-contact metal layer 42 and the n-contact interconnect 44 comprise a single layer or a plurality of layers that include conductive metals, such as one or more of Al, Ti, and alloys thereof.

As illustrated, the p-contact 36 may be formed on the barrier layer 34, and one or more top passivation layers 46-1, 46-2 may be provided on one or more top or side surfaces of the n-type layer 18 for additional electrical insulation. In FIG. 1, the top passivation layer 46-2 is arranged to cover mesa sidewalls 12' of the active LED structure 12. The top passivation layers 46-1, 46-2 may comprise separate layers of a continuous layer of dielectric material, such as silicon nitride.

As mentioned above, the active LED structure 12 is bonded to the carrier submount 14 by way of one or more of the bond metal layers 22. Exemplary bond metal layers 22 may include gold (Au), tin (Sn), nickel (Ni), palladium (Pd), titanium (Ti), tungsten (W), and alloys thereof. During bonding, such as a eutectic bonding process, the bond metal layers 22 are heated to collectively form bonding materials (e.g., one or more eutectic alloys) between the active LED structure 12 and the carrier submount 14. Bonding conditions such as temperature, bonding pressure, and cooling rates may need to be controlled or adjusted to provide adequate bonding strength. When vertical LED chips have regions of different topography above the carrier submount 14, such as regions underneath or registered with the p-contact 36, voiding 48 of the bonding materials may form and cause localized bonding strength to be reduced.

Figure 2:
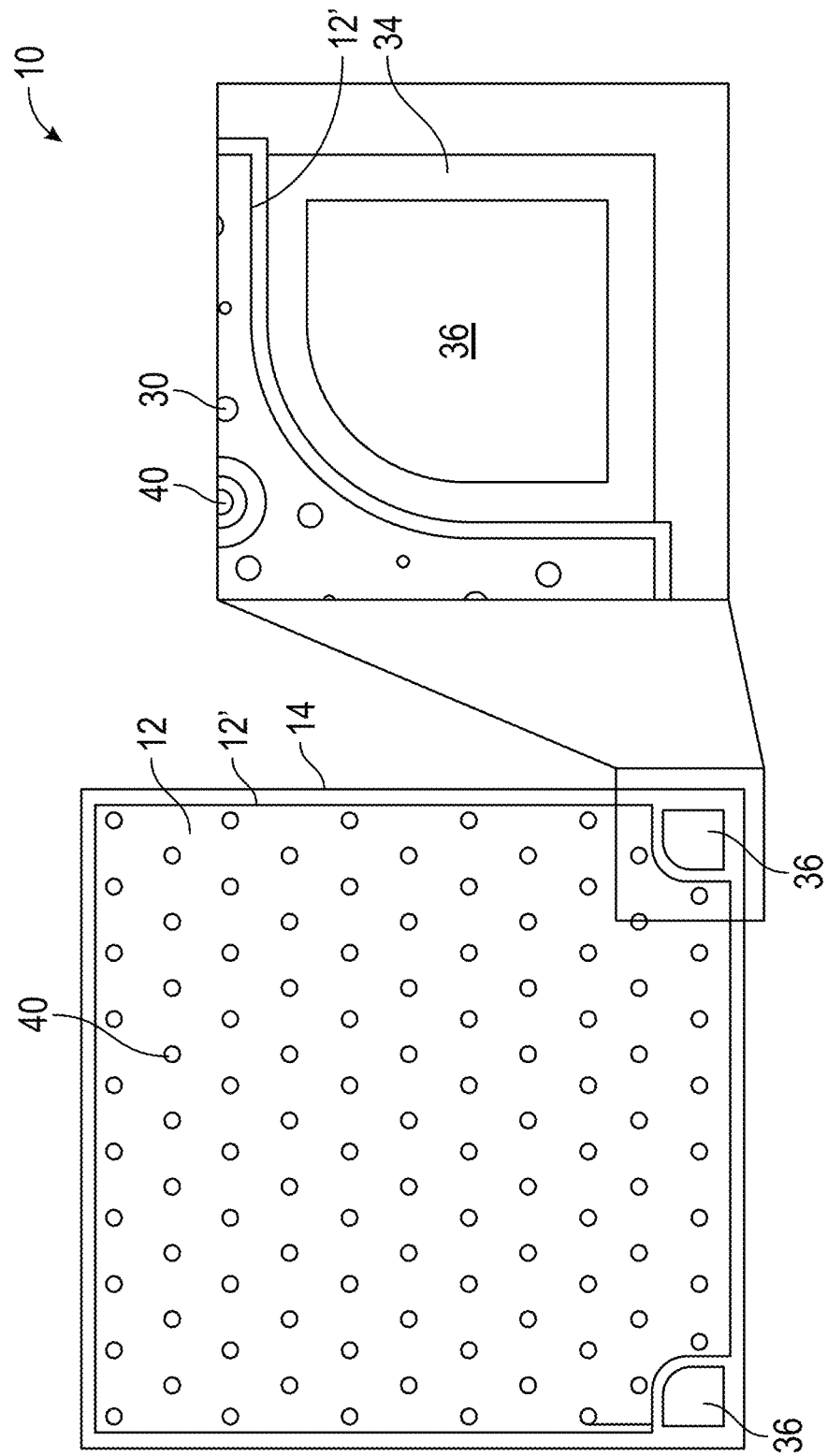
FIG. 2 is a full topside view of the LED chip of FIG. 1 according to principles of the present disclosure.

FIG. 2 is a full topside view of the LED chip 10 of FIG. 1 according to principles of the present disclosure. As illustrated, the mesa sidewalls 12' of the active LED structure 12 are just inset from peripheral edges of the carrier submount 14. Additionally, the mesa sidewalls 12' follow a shape of the p-contacts 36 at corners of the LED chip 10. While the p-contacts 36 are illustrated in the corners in FIG. 2, it is understood the p-contacts 36 may reside at other locations of the LED chip 10, such as along one or more of the peripheral edges of the submount 14 that are in between the corners. The regions of the LED chip that are between the p-contacts 36 and the submount 14 have a different topography than regions of the LED chip 10 that are under the active LED structure 12 as best illustrated in FIG. 1. Voiding of the underlying bonding materials underneath the p-contacts 36 can lead to mechanical instability and reliability concerns.

Figure 3:
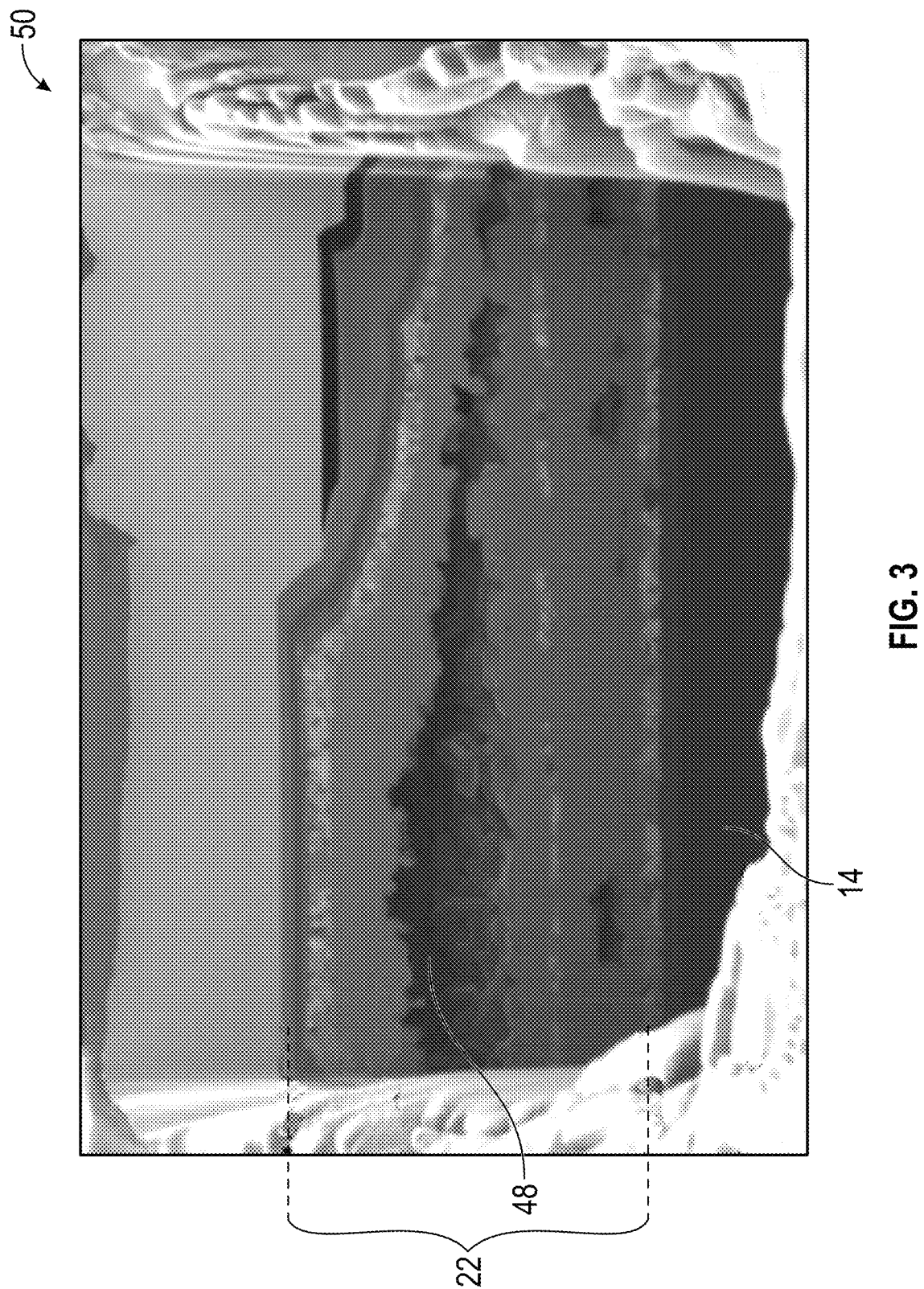
FIG. 3 is a focused ion beam (FIB) image of a cross-section of an LED chip with voiding of bonding metal layers.

FIG. 3 is a focused ion beam (FIB) image of a cross-section an LED chip 50 with voiding 48 of bonding metal layers 22. As illustrated, the voiding 48 may form in regions of the bonding metal layers 22 with different topography. In the image of FIG. 3, the voiding 48 occurs to the left of the image where the bonding metal layers 22 are needed to fill more space above the carrier submount 14.

Figure 4:
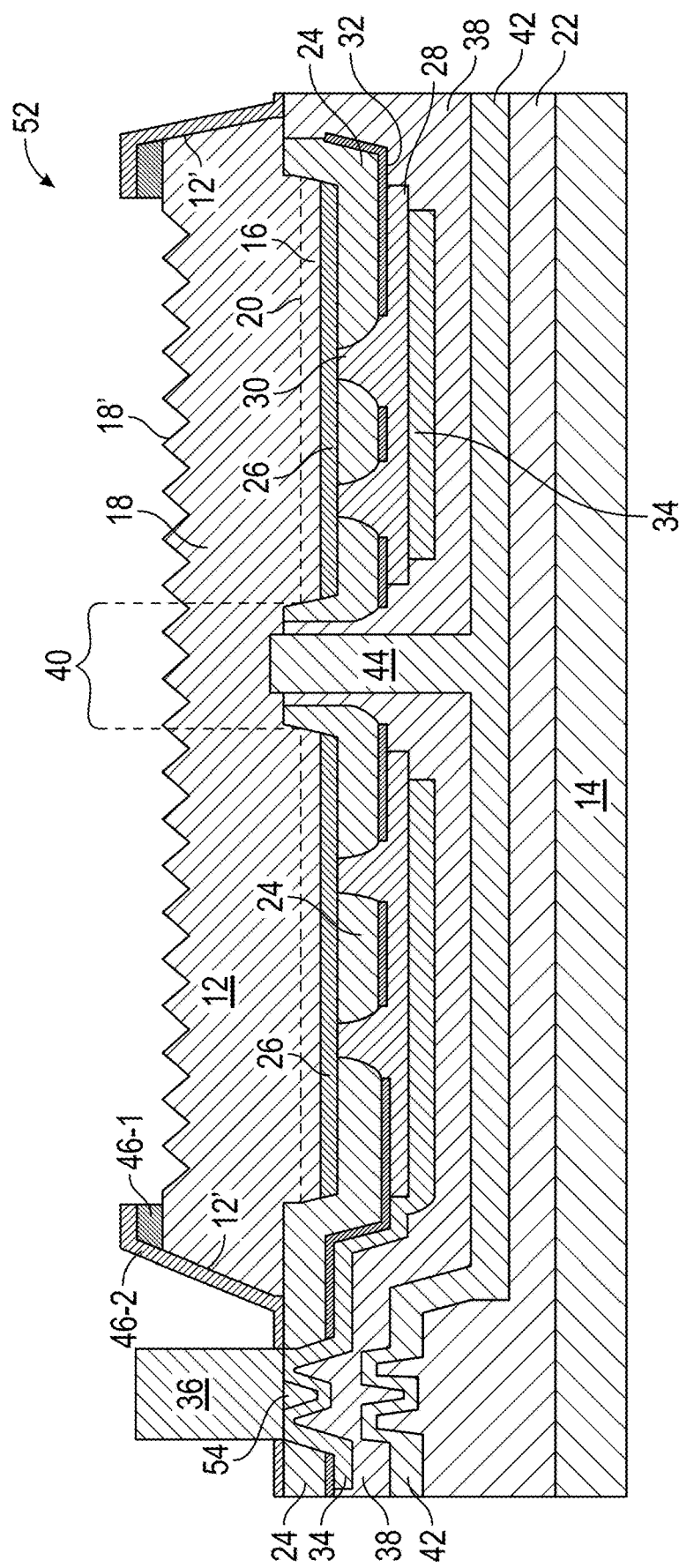
FIG. 4 is a top view of a portion of an LED chip that is similar to the LED chip of FIGS. 1 and 2 and further includes a dielectric structure beneath the p-contact that changes the topography of the underlying layers.

FIG. 4 is a top view of a portion of an LED chip 52 that is similar to the LED chip 10 of FIGS. 1 and 2 and further includes a dielectric structure 54 beneath the p-contact 36 that changes the topography of the underlying layers. The dielectric structure 54 is arranged between the p-contact 36 and the barrier layer 34. The dielectric structure 54 may form one or more dielectric regions that are registered below the p-contact 36 to define areas of the p-contact 36 where the barrier layer 34 is electrically connected to the p-contact 36. The one or more dielectric regions may be formed with an area that is smaller than an area of the p-contact 36. In certain embodiments, portions of the p-contact 36 may directly contact the dielectric structure 54. As illustrated, the barrier layer 34 is conformal along the dielectric structure 54 to electrically connect with the p-contact 36 in areas adjacent the dielectric structure 54. In certain embodiments, the dielectric structure 54 comprises a same material as the first reflective layer 24 such that the dielectric structure 54 may be formed or patterned at a same time as openings in the first reflective layer 24 are formed to provide locations for the reflective layer interconnects 30. In other embodiments, the dielectric structure 54 may comprise a different material than the first reflective layer 24, such as silicon nitride. As illustrated, the dielectric structure 54 forms a topography below the p-contact 36, and the underlying layers of the barrier layer 34, the passivation layer 38, the n-contact metal layer 42, and the bond metal layer 22 may conform along this topography. As will be described in more detail below for FIGS. 5A and 5B, the shape and/or pattern of the dielectric structure 54 may be provided to control the locations of the underlying layers with reduced voiding.

Figure 5B:
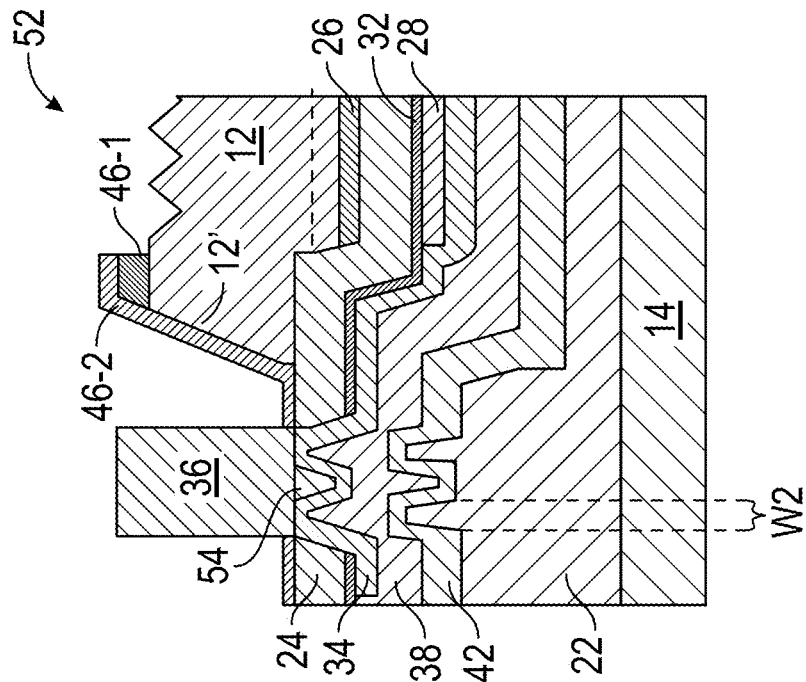
FIG. 5B is a cross-section of a portion of the LED chip of FIG. 5B where the dielectric structure provides an internal topography that reduces voiding in the bonding metal layer.
Figure 5A:
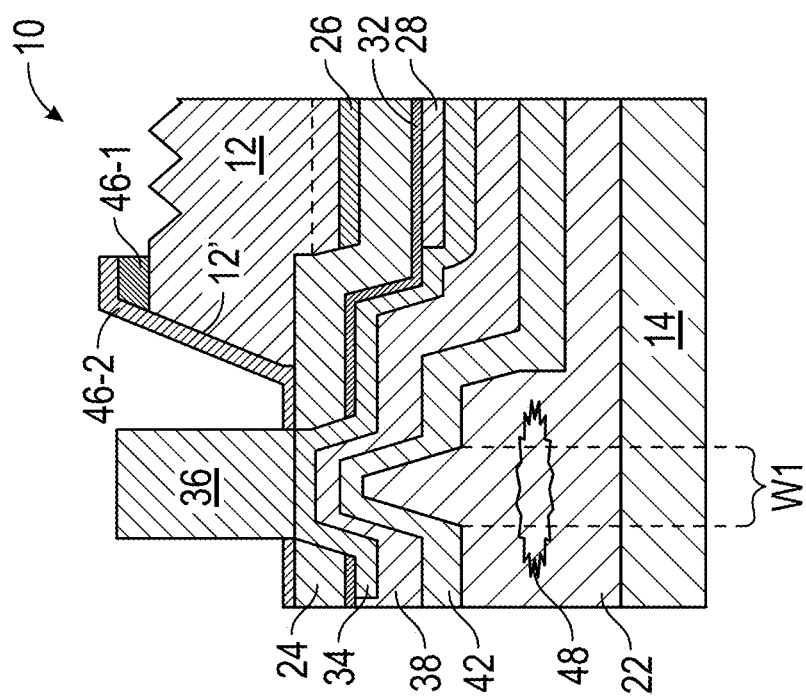
FIG. 5A is a cross-section of a portion of the LED chip of FIG. 1 illustrating voiding that may occur under the p-contact.

FIG. 5A is a cross-section of a portion of the LED chip 10 of FIG. 1 illustrating voiding 48 that may occur under the p-contact 36. FIG. 5B is a cross-section of a portion of the LED chip 52 of FIG. 5B where the dielectric structure 54 provides an internal topography that reduces voiding 48 in the bond metal layer 22. As illustrated in both FIGS. 5A and 5B, portions of the first reflective layer 24 are removed to allow the barrier layer 34 to electrically connect with the p-contact 36. When the passivation layer 38, the n-contact metal layer 42, and the bond metal layer 22 are subsequently formed, they may collectively follow a contour beneath the p-contact 36, thereby creating regions with larger volumes of space for the bond metal layer 22 to fill. In FIG. 5A, a first width W1 corresponds with a region registered below the p-contact 36 that the bond metal layer 22 should fill. As illustrated, if the first width W1 is too large, such as greater than about 11 microns (μm), voiding 48 may occur in the bond metal layer 22. In FIG. the presence of the dielectric structure 54 creates a topography below the p-contact 36 with regions of smaller volumes of space for the bond metal layer 22 to fill during bonding. A second width W2 in FIG. 5B corresponds to a spacing provide by the dielectric structure 54 where the barrier layer 34 is able to electrically contact the p-contact 36. When the second width W2 is less than or equal to 11 μm, material of the bond metal layer 22 may reflow to fill the corresponding regions without the voiding 48 of FIG. 5A. In certain embodiments, the second width W2 may be less than or equal to 10 μm, or less than or equal to 10 μm, or less than or equal to 8 μm, or in a range from 0.5 μm to 11 μm. In certain embodiments, the dielectric structure 54 may be formed with complex structures, such as rows of stripes and/or arrays of islands. In such embodiments, the second width W2 corresponds with a spacing between adjacent stripes and/or islands.

Figure 6:
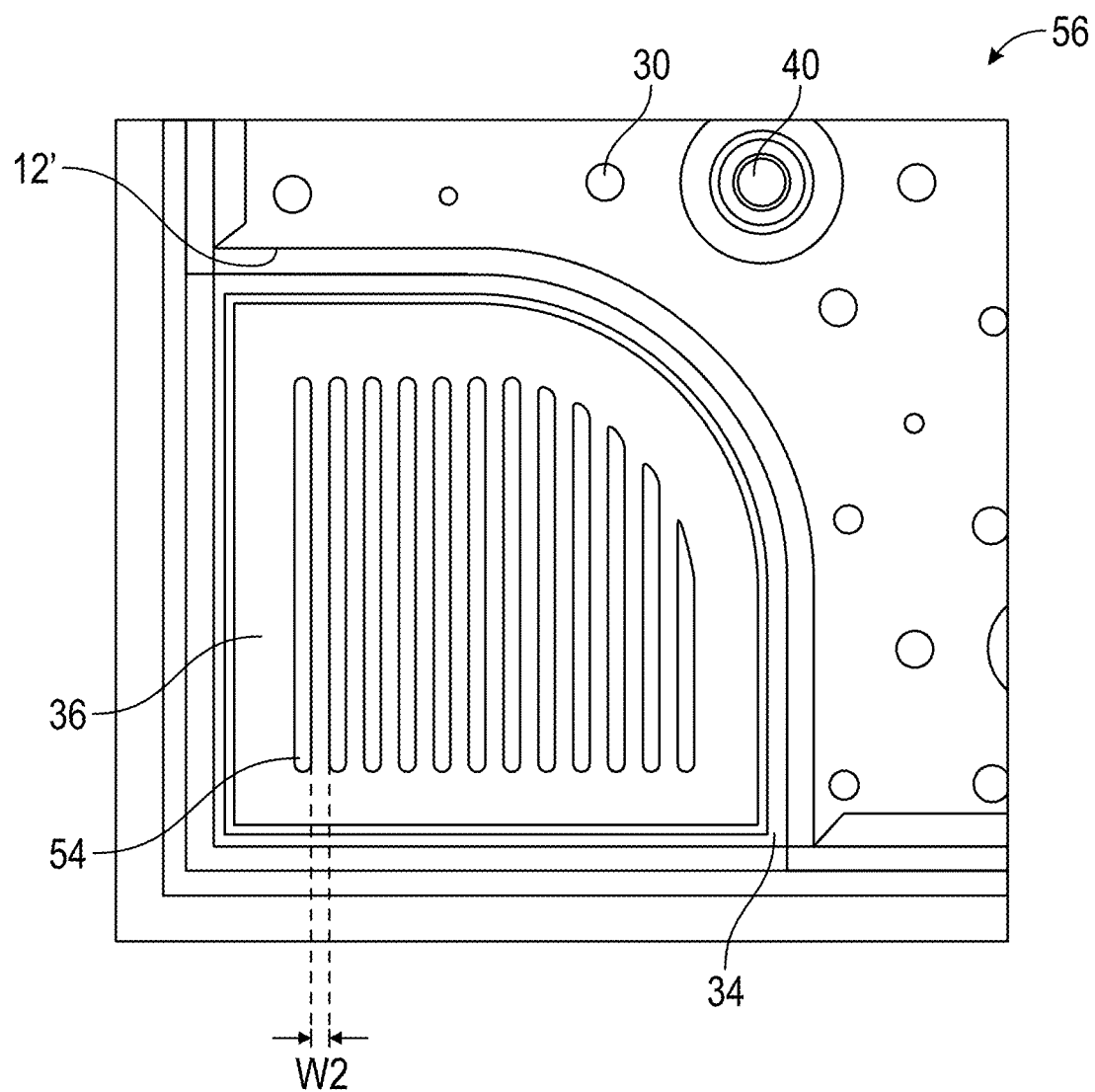
FIG. 6 is a top view of a portion of an LED chip that is similar to the LED chip of FIG. 4.

FIG. 6 is a top view of a portion of an LED chip 56 that is similar to the LED chip 52 of FIG. 4. The view provided is from the perspective of a corner of the LED chip 56 at the p-contact 36 in a similar manner to what is illustrated in FIG. 2 for the LED chip 10. As illustrated in FIG. 6, the dielectric structure 54 forms multiple rows of stripes beneath the p-contact 36 to reduce voiding as described above. The spacing or pitch of the stripes may be set as the second width W2 as described above for FIG. 5B.

Figure 7:
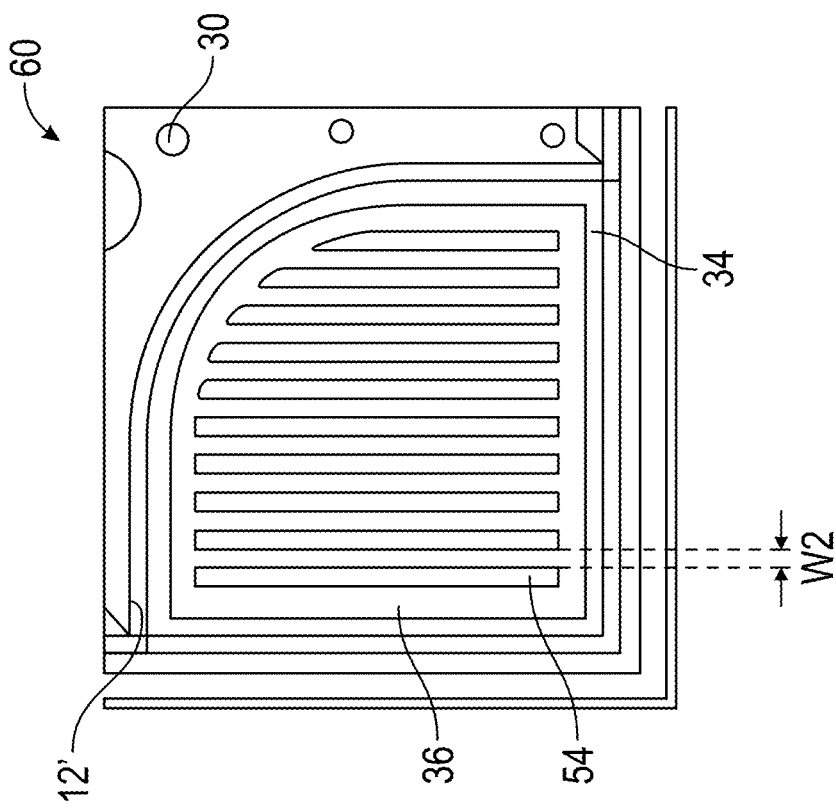
FIG. 7 is a top view of a portion of an LED chip that is similar to the LED chip of FIG. 6 where the dielectric structure is arranged with fewer stripes below the p-contact.

FIG. 7 is a top view of a portion of an LED chip 58 that is similar to the LED chip 56 of FIG. 6 where the dielectric structure 54 is arranged with fewer stripes below the p-contact 36. Depending on relative dimensions of the p-contact 36, fewer stripes may be provided as long as the second width W2 is less than or equal to 11 μm to reduce voiding.

Figure 8:
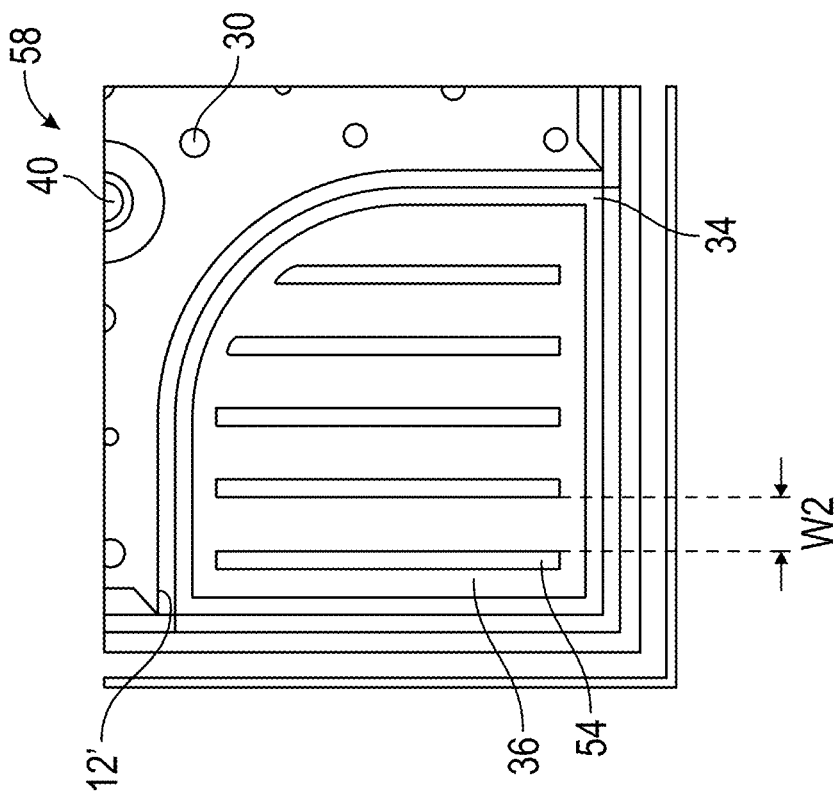
FIG. 8 is a top view of a portion of an LED chip that is similar to the LED chip of FIG. 7 where the dielectric structure is arranged with an increased number of stripes below the p-contact.

FIG. 8 is a top view of a portion of an LED chip 60 that is similar to the LED chip 58 of FIG. 7 where the dielectric structure 54 is arranged with an increased number of stripes below the p-contact 36. In this manner, increased numbers of the stripes may be provided with decreased values for the second width W2 that are less than or equal to 11 μm and as low as about 0.5 μm to reduce voiding.

Figure 9:
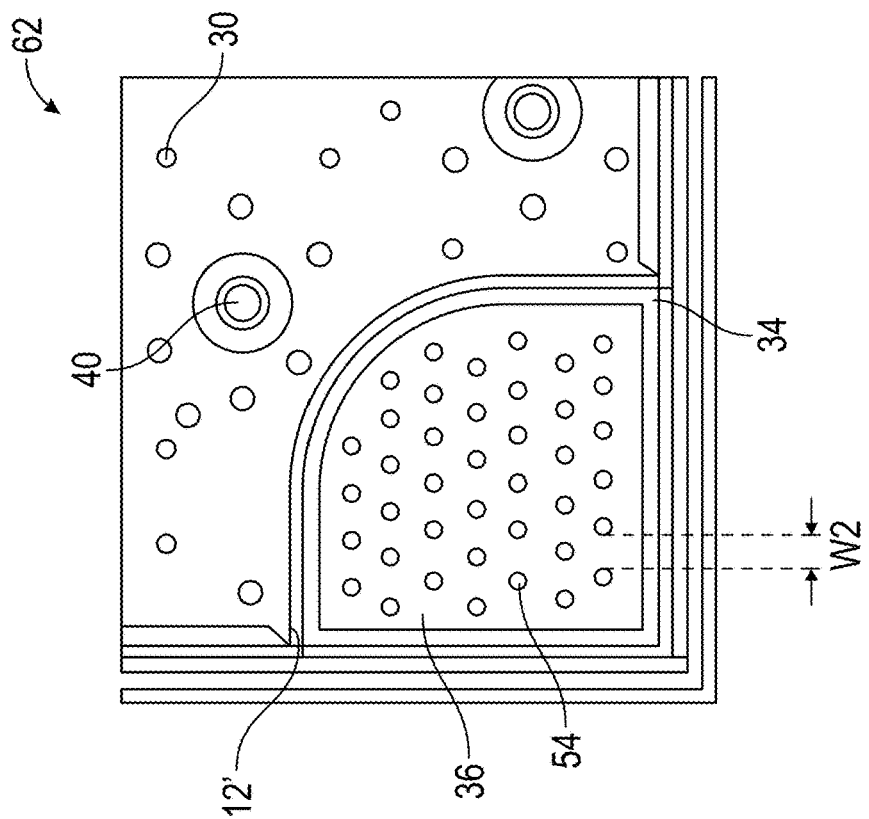
FIG. 9 is a top view of a portion of an LED chip that is similar to the LED chip of FIG. 6 where the dielectric structure is arranged as an array of islands or dots below the p-contact.

FIG. 9 is a top view of a portion of an LED chip 62 that is similar to the LED chip 56 of FIG. 6 where the dielectric structure 54 is arranged as an array of islands or dots below the p-contact 36. As illustrated, the array of islands may be provided with a pitch that corresponds with the second width W2 that is less than or equal to 11 μm for reduced voiding. By providing the array of islands, the p-contact 36 may be formed with increased surface area for electrical connections with the underlying barrier layer 34 of FIG. 4 while also providing suitable topography for reduced voiding.

Figure 10:
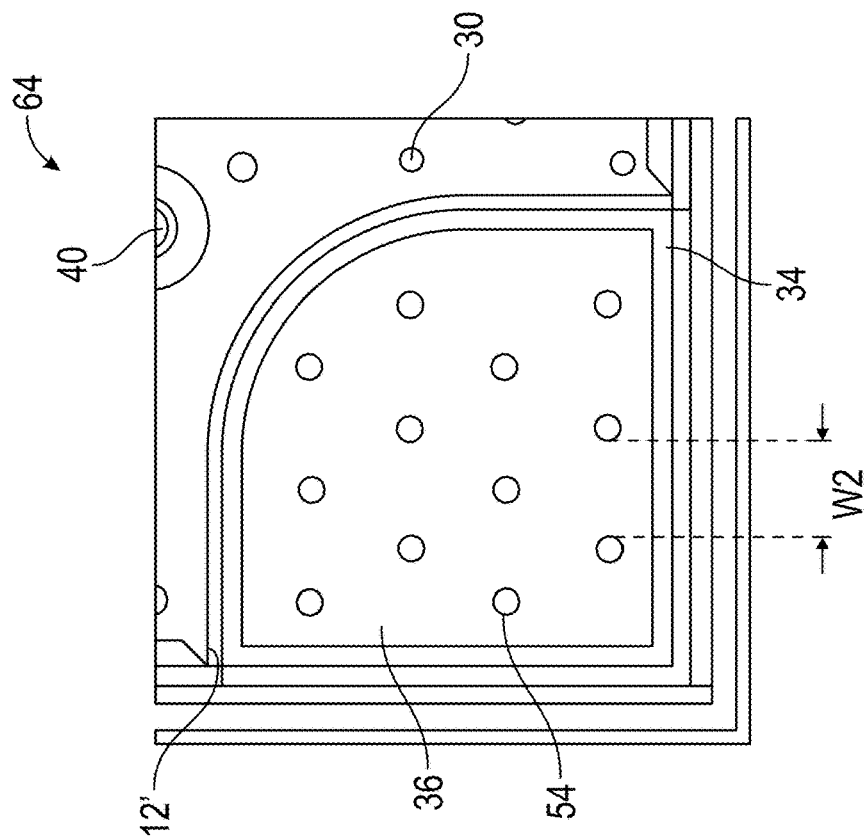
FIG. 10 is a top view of a portion of an LED chip that is similar to the LED chip of FIG. 9 where the dielectric structure is arranged as an array of islands or dots below the p-contact with a tighter pitch.

FIG. 10 is a top view of a portion of an LED chip 64 that is similar to the LED chip 62 of FIG. 9 where the dielectric structure 54 is arranged as an array of islands or dots below the p-contact 36 with a tighter pitch. In this regard, the second width W2 may be further reduced while also providing suitable contact area for the p-contact 36 and reduced voiding underneath.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) chip, comprising:
a carrier submount;
an active LED structure bonded to the carrier submount, the active LED structure comprising an n-type layer, a p-type layer, and an active layer that is between the n-type layer and the p-type layer, the active LED structure forming a mesa with mesa sidewalls that define a perimeter of the active LED structure;
a contact on the carrier submount in a position that is outside the mesa sidewalls;
a barrier layer forming an electrically conductive path between the active LED structure and the contact; and
a dielectric structure between the contact and the barrier layer, the dielectric structure comprising at least one dielectric region positioned entirely beneath an area of the contact, the barrier layer electrically connecting with the contact adjacent the at least one dielectric region beneath the contact.

2. The LED chip of claim 1, wherein at least one the dielectric region defines a width where the barrier layer electrically connects with the contact, and the width is less than or equal to 11 microns (μm).

3. The LED chip of claim 1, wherein the at least one dielectric region is one of a plurality of regions of dielectric material that are registered below the contact.

4. The LED chip of claim 3, wherein the plurality of regions of dielectric material are arranged with a pitch that is less than or equal to 11 microns (μm).

5. The LED chip of claim 3, wherein the plurality of regions of dielectric material form a plurality of stripes below the contact.

6. The LED chip of claim 3, wherein the plurality of regions of dielectric material form a plurality of islands below the contact.

7. The LED chip of claim 1, further comprising:
a dielectric reflective layer on the active LED structure; and
a metal reflective layer on the dielectric reflective layer and electrically coupled to the active LED structure through the dielectric reflective layer, wherein the dielectric structure comprises a same material as the dielectric reflective layer.

8. The LED chip of claim 1, further comprising:
a dielectric reflective layer on the active LED structure; and
a metal reflective layer on the dielectric reflective layer and electrically coupled to the active LED structure through the dielectric reflective layer, wherein the dielectric structure comprises a different material than the dielectric reflective layer.

9. The LED chip of claim 1, further comprising an n-contact metal electrically coupled with the n-type layer, wherein a portion of the n-contact metal extends to a position that is beneath the contact and between the barrier layer and the carrier submount.

10. The LED chip of claim 9, further comprising a passivation layer that is between the barrier layer and the n-contact metal.

11. The LED chip of claim 10, wherein the n-contact metal forms a contour shape beneath the contact, and the contour shape is defined by a shape of the dielectric structure.

12. A light-emitting diode (LED) chip, comprising:
a carrier submount;
an active LED structure bonded to the carrier submount, the active LED structure comprising an n-type layer, a p-type layer, and an active layer that is between the n-type layer and the p-type layer, the active LED structure forming a mesa with mesa sidewalls that define a perimeter of the active LED structure;
a p-contact on the carrier submount in a position that is outside the mesa sidewalls;
a barrier layer forming an electrically conductive path between the p-type layer and the p-contact; and
a dielectric structure beneath the p-contact in a position that is between the barrier layer and the p-contact, the dielectric structure comprising at least one dielectric region positioned entirely beneath an area of the p-contact, the barrier layer conformally covering the at least one dielectric region and electrically connecting with the p-contact adjacent the dielectric structure beneath the p-contact.

13. The LED chip of claim 12, wherein the at least one dielectric region is one of a plurality of dielectric regions that are beneath the p-contact, and the barrier layer electrically connects with the p-contact between adjacent dielectric regions of the plurality of dielectric regions.

14. The LED chip of claim 13, wherein the plurality of dielectric regions is arranged with a pitch in a range from 0.5 microns (μm) to less than or equal to 11 μm.

15. The LED chip of claim 13, wherein the plurality of dielectric regions form a plurality of stripes beneath the p-contact.

16. The LED chip of claim 13, wherein the plurality of dielectric regions form a plurality of islands beneath the p-contact.

17. The LED chip of claim 12, further comprising:
a dielectric reflective layer on the active LED structure; and
a metal reflective layer on the dielectric reflective layer and electrically coupled to the p-type layer through the dielectric reflective layer, wherein the dielectric structure comprises a same material as the dielectric reflective layer.

18. The LED chip of claim 12, further comprising:
a dielectric reflective layer on the active LED structure; and
a metal reflective layer on the dielectric reflective layer and electrically coupled to the p-type layer through the dielectric reflective layer, wherein the dielectric structure comprises a different material than the dielectric reflective layer.

19. The LED chip of claim 12, further comprising an n-contact metal electrically coupled with the n-type layer, wherein a portion of the n-contact metal extends to a position that is beneath the p-contact and between the barrier layer and the carrier submount, and wherein the n-contact metal forms a contour shape beneath the p-contact and the contour shape is defined by a shape of the dielectric structure.

20. The LED chip of claim 19, further comprising a passivation layer that is between the barrier layer and the n-contact metal.

* * * * *